United States Patent
Mattingly (10) Patent No.: US 10,277,127 B2
(45) Date of Patent: Apr. 30, 2019

(54) ENHANCED FAULT REPORTING IN VOLTAGE REGULATORS

(71) Applicant: INTERSIL AMERICAS LLC, Milpitas, CA (US)

(72) Inventor: Douglas M. Mattingly, Bahama, NC (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 219 days.

(21) Appl. No.: 15/012,786

(22) Filed: Feb. 1, 2016

(65) Prior Publication Data

US 2017/0110963 A1    Apr. 20, 2017

Related U.S. Application Data

(60) Provisional application No. 62/243,035, filed on Oct. 17, 2015, provisional application No. 62/271,991, filed on Dec. 28, 2015.

(51) Int. Cl.
| | |
|---|---|
| *G06F 1/00* | (2006.01) |
| *H02M 3/158* | (2006.01) |
| *G01R 31/40* | (2014.01) |
| *G06F 1/28* | (2006.01) |

(52) U.S. Cl.
CPC ............ *H02M 3/158* (2013.01); *G01R 31/40* (2013.01); *G06F 1/28* (2013.01); *H02M 3/1584* (2013.01)

(58) Field of Classification Search
CPC .................. H02M 3/158; H02M 1/32; H02M 2001/0009; G06F 1/28; G06F 1/30; G06F 11/00; G06F 11/0751; G06F 11/079
See application file for complete search history.

(56) References Cited

U.S. PATENT DOCUMENTS

| | | | | |
|---|---|---|---|---|
| 6,301,133 | B1 * | 10/2001 | Cuadra | ................... H02J 1/102 363/65 |
| 8,710,810 | B1 * | 4/2014 | McJimsey | ........... H02M 3/1584 323/272 |
| 9,385,608 | B1 * | 7/2016 | Chakraborty | ....... H02M 3/1584 |
| 2006/0107118 | A1 * | 5/2006 | Alperin | .............. G01R 31/3183 714/36 |

(Continued)

OTHER PUBLICATIONS

"Multiphase PWM Regulator for AMD Fusion Desktop CPUs Using SVI2.0", Mar. 26, 2014, pp. 135, Publisher: Intersil.

*Primary Examiner* — Xuxing Chen
(74) *Attorney, Agent, or Firm* — Foley & Lardner LLP (57) ABSTRACT

An electronic system, voltage regulator, controller and fault reporting method and circuit for a voltage regulator or other type of DC-DC converter are disclosed. For example, a fault reporting circuit is disclosed. The fault reporting circuit includes a first transistor device configured to generate a first signal indicating an occurrence of a fault in an associated circuit, a second transistor device coupled to the first transistor device, the second transistor device configured to generate at least one data signal indicating an identity of the fault in the associated circuit, and an output coupled to the first transistor device and the second transistor device, wherein the output is configured to receive the first signal and the at least one data signal. In some implementations, the fault reporting circuit is in a controller for a voltage regulator circuit formed on one or more semiconductor ICs, wafers, chips or dies.

27 Claims, 5 Drawing Sheets

(56) References Cited

U.S. PATENT DOCUMENTS

2008/0239593 A1* 10/2008 Lavier .................... G01R 31/40
361/18
2010/0097733 A1* 4/2010 E. ......................... H02H 1/0015
361/42

* cited by examiner

ENHANCED FAULT REPORTING IN VOLTAGE REGULATORS

CROSS-REFERENCE TO RELATED APPLICATIONS

This application is related to U.S. Provisional Patent Application Ser. No. 62/243,035 entitled "ENHANCED FAULT REPORTING IN VOLTAGE REGULATORS," filed on Oct. 17, 2015, and U.S. Provisional Patent Application Ser. No. 62/271,991 entitled "ENHANCED FAULT REPORTING IN VOLTAGE REGULATORS," filed on Dec. 28, 2015, both of which are incorporated herein by reference. This application hereby claims to the benefit of U.S. Provisional Patent Applications Ser. Nos. 62/243,035 and 62/271,991.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings.

DETAILED DESCRIPTION

The complexity of voltage regulators utilized in integrated circuit power supplies is constantly increasing. This complexity is further increased when multiple voltage regulators controlled by one integrated circuit are required to regulate the voltages on more than one output rail of a power supply involved. For example, if a fault occurs and one voltage regulator shuts down, it is not only labor intensive and time consuming to determine the root cause of the failure, but the identity of the particular rail that caused the shutdown also has to be determined in order to effectively troubleshoot the problem. Numerous protection features can also shut a voltage regular circuit down, such as over-voltage or over-current protection, under-voltage protection, thermal protection, enable protection and the like. Fault troubleshooting can be accomplished in existing power management controller circuits, but the fault information has to be retrieved by tapping into a communication bus to read the contents of specific registers set aside for fault reporting. A significant problem with these fault reporting techniques is that specialized and expensive software, hardware and personnel training are required in order to obtain and effectively utilize the fault information involved. As such, substantial time delays can occur that can lead to catastrophic component failures as a result.

Furthermore, existing fault analyses are typically performed at the manufacturer's facility since remote debugging of faults and forwarding fault data to the manufacturer is an inherently inefficient and costly process. Moreover, factory analyses of faulty customer boards is also inherently inefficient, because of the time delays involved (e.g., shipping and set up times, iterative testing times, etc.) and the fact that the original fault conditions may not be repeatable. Nevertheless, as described below, the present invention resolves these and other, related problems with enhanced fault reporting in voltage regulator circuits formed on integrated circuits, wafers, chips or dies.

For example, fault reporting circuits (e.g., Power Good or PGOOD circuits) are utilized in power management integrated circuits (e.g., integrated circuit power supplies utilized in PCs, notebooks, desktops, servers, tablets, and the like) to indicate the state of the regulated output voltage. The fault reporting (e.g., PGOOD) pin of the integrated circuit is typically connected externally to a pull-up voltage through a resistor, and internally to the integrated circuit, the fault reporting pin is typically connected to the drain of an n-channel NFET with its source tied to ground. While the NFET is turned off, the voltage signal at the fault reporting pin is pulled up through the external resistor, which typically indicates that the output voltage is being regulated with acceptable accuracy ("in regulation"), i.e., the "power is good", corresponding to PGOOD at logic High level. When the NFET is turned on, the voltage signal at the fault reporting pin is pulled low, which indicates that the accuracy of the output voltage is not acceptable ("out of regulation), and/or a fault has occurred, i.e., "power is not good", corresponding to PGOOD at logic Low level. Certain fault reporting (e.g., PGOOD) output voltage levels are utilized as thresholds to define whether the voltage signal on the fault reporting pin indicates a high or low state. These threshold levels are referred to, respectively, as Logic High and Logic Low thresholds. For example, if the voltage signal on a PGOOD pin is lower than the Logic Low threshold value, then that indicates that a fault has occurred and/or the regulator is not in regulation.

In accordance with embodiments of the present invention, an operator can utilize an oscilloscope (e.g., single channel of a digital oscilloscope) or similar test instrument to probe a fault reporting pin (e.g., PGOOD pin) of an integrated circuit (e.g., voltage regulator, power supply, controller, etc.) immediately if a fault event has occurred (and prior to the fault information being cleared). The operator can read the specific fault information on the fault reporting pin, and utilizing a lookup table, for example, infer from that information the root cause of the fault that occurred. The fault information on the fault reporting pin is coded in a way to appear as digital data but it can be readily viewed and decoded by a user. In one exemplary embodiment, the data conveyance technique utilizes the PGOOD pin of an integrated circuit preferably when a fault has occurred and the signal on the PGOOD pin is actively held low. For example, the fault data signal on the PGOOD pin can toggle between 0V and a voltage level that is well below the Logic Low voltage threshold level. Consequently, a logic device monitoring the fault occurrence signal on the PGOOD pin will not recognize a change in its logic state while the fault data signal is also present on the pin. This ability to quickly determine the fault condition or identity of the fault from the data on the PGOOD pin will enhance the initial testing of new power management integrated circuits during pre-production testing and production runs, which will also result in more quickly and effectively diagnosing faults in the field.

Figure 1:
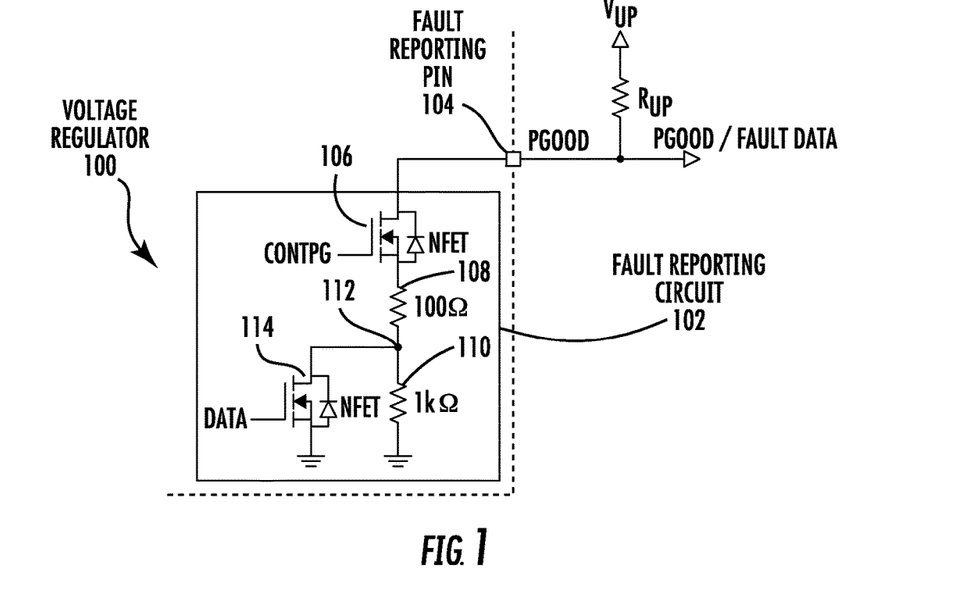
FIG. 1 depicts a schematic circuit diagram of a portion of a voltage regulator including a fault reporting circuit that can be utilized to implement one exemplary embodiment of the present invention.

FIG. 1 depicts a schematic circuit diagram of a portion of a voltage regulator (e.g., formed on an integrated circuit, wafer, chip or die) 100 including a fault reporting circuit 102, which can be utilized to implement one exemplary embodiment of the present invention. In the exemplary embodiment shown, the fault reporting circuit 102 is implemented utilizing a PGOOD circuit and output pin. However, it should be understood that the scope of coverage of the present application is not intended to be limited to the utilization of just the PGOOD circuit and pin shown in FIG. 1, and in some embodiments any suitable fault reporting circuit and output pin can be utilized. In any event, for the exemplary embodiment depicted in FIG. 1, a small window voltage from circuit ground (e.g., zero volts) up to but below the Logic Low threshold voltage level is generated and utilized to convey precise information or data about the fault(s) that occurred and caused the voltage signal on the PGOOD pin to go Low. Referring to FIG. 1, the voltage regulator 100 includes a PGOOD pin 104 coupled to the fault reporting circuit 102. The PGOOD pin 104 is connected (typically externally) to a pull-up voltage, $V_{UP}$, through a pull-up resistor, $R_{UP}$. Internally to the voltage regulator 100, the PGOOD pin 104 is connected to the drain terminal of a first n-channel FET (NFET) 106 of the fault reporting circuit 102. The control (gate) terminal of the NFET 106 is configured to receive a fault occurrence (CONTPG) voltage signal if a fault has occurred in the voltage regulator 100. The source terminal of the NFET 106 is connected to a voltage divider circuit including two resistors 108 and 110 connected together at a node 112. In the exemplary embodiment shown, resistor 108 has a value of 100Ω and resistor 110 has a value of 1kΩ. The drain terminal of a second NFET 114 is connected to the node 112 between the resistors 108 and 110 in the voltage divider circuit. The control (gate) terminal of the NFET 114 is configured to receive a data voltage signal (DATA), which provides specific information about, or the precise identity of, any fault that has occurred. The source of the NFET 114 is connected to circuit ground.

The following Table 1 indicates exemplary voltage levels for the combined PGOOD/fault data signal present at the PGOOD pin 104 in the exemplary embodiment depicted in FIG. 1, with the pullup resistor, $R_{UP}$, having a value of 10kΩ and assuming that the Rdson of NFET 106 is significantly lower than 100Ω.

TABLE 1

| CONTPG | DATA | PGOOD/DATA |
| --- | --- | --- |
| HIGH | HIGH | 0.0099* $V_{UP}$ |
| HIGH | LOW | 0.099* $V_{UP}$ |

TABLE 1-continued

| CONTPG | DATA | PGOOD/DATA |
| --- | --- | --- |
| LOW | HIGH | $V_{UP}$ |
| LOW | LOW | $V_{UP}$ |

In operation, referring to FIG. 1 and Table 1 above, NFET 106 generates a signal at fault reporting pin, PGOOD pin 104 that indicates the presence or absence of a fault in the voltage regulator 100. This signal is referred to herein as a "fault indicator signal." When the CONTPG voltage signal is low, NFET 106 is not conducting (off) and the voltage of the fault indicator signal on the PGOOD pin 104 is equal to $V_{UP}$, which is above the Logic High threshold value and thus indicates the output voltage is within regulation. If the CONTPG voltage signal goes high, the voltage of the fault indicator signal on the PGOOD pin 104 is pulled below the Logic Low threshold value regardless of the state of the NFET 114. Any external digital (e.g., logic) circuitry coupled to the PGOOD pin 104 will interpret this voltage level as a Low level on the PGOOD pin, which indicates that the regulator is out of regulation, and/or a fault has occurred. When the voltage of the fault indicator signal on the PGOOD pin 104 is below the Logic Low threshold value, the DATA signal on the control terminal of the NFET 114 can be toggled high and low (e.g., digital data) to convey specific fault information (e.g., identity of the fault) that occurred by superimposing a data signal on the fault indicator signal via the PGOOD pin 104. This combined signal at PGOOD pin 104 is referred to herein as the "superimposed signal." The combined or superimposed signal is readable by an oscilloscope or suitable other test equipment for a user to view and determine (e.g., utilizing a look-up table) the specific fault(s) involved.

Figure 2:
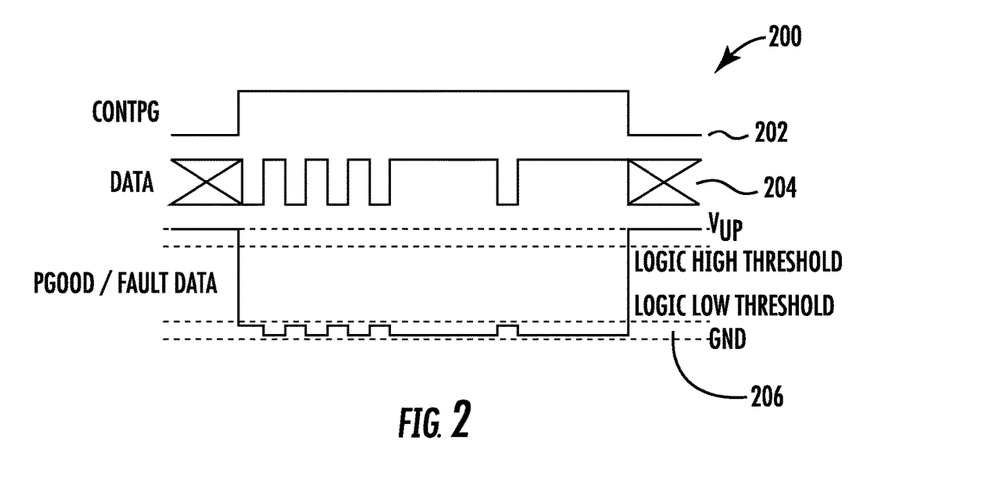
FIG. 2 is a voltage waveform diagram depicting how the voltage on a fault reporting pin can be utilized to convey specific fault information, in accordance with one exemplary embodiment of the present invention.

For example, FIG. 2 is an exemplary voltage waveform diagram 200 depicting how the voltage of the superimposed signal on a fault reporting pin (e.g., PGOOD pin) of a voltage regulator circuit (e.g., 100 shown in FIG. 1) can be utilized to convey specific fault information when the voltage of the fault indicator signal on the fault reporting or PGOOD pin is pulled below the Logic Low threshold level (e.g., out of regulation and/or a fault has occurred). Referring also to FIG. 1, and as indicated at 202, the CONTPG voltage signal at the control terminal of the NFET 106 is high, which indicates that a fault has occurred in the voltage regulator 100. Thus, the NFET 106 is turned on. While the NFET 106 is on, the fault data signal DATA at the control terminal of the NFET 114 toggles the NFET 114 to produce the fault data signal at the PGOOD pin 104, as indicated at 204. Note that, as indicated at 206, by applying the CONTPG and DATA voltage signals (e.g., combined or superimposed signal) to the PGOOD pin 104, the maximum level of the fault DATA voltage signals is below the Logic Low threshold level. Consequently, a logic device or similar test device monitoring the voltage signal on the PGOOD pin 104 will not recognize a change in the Logic state at the PGOOD pin 104 due to the fault DATA signal being sent, and this voltage signal on the PGOOD pin 104 will be sensed as Logic Low continuously.

Figure 3:
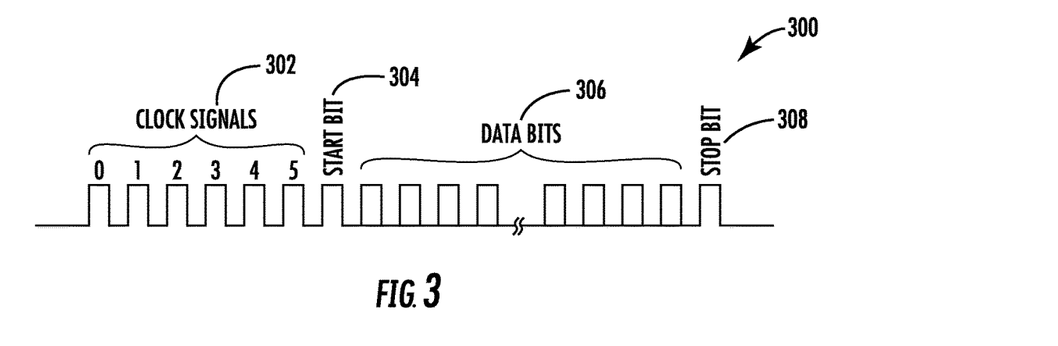
FIG. 3 is a voltage waveform diagram depicting how fault data can be conveyed via a fault reporting pin of a voltage regulator circuit, in accordance with one exemplary embodiment of the present invention.

FIG. 3 is an exemplary voltage waveform diagram 300 depicting how fault data can be conveyed via a fault reporting pin (e.g., PGOOD pin) of a voltage regulator formed on an integrated circuit, in accordance with one exemplary embodiment of the present invention. For example, the fault data can be conveyed utilizing the fault reporting circuit 102 depicted in FIG. 1. For the embodiment depicted in FIG. 3, the fault data is conveyed while the voltage of the fault indicator signal on the fault reporting or PGOOD pin is below the Logic Low threshold level, and the voltage regulator circuit is conveying the fault data via the fault reporting or PGOOD pin. As indicated at 302, the data stream may start with a plurality of clock signals. The precise number of clock signals being sent via the fault reporting or PGOOD pin is not significant, as long as the minimum number of clock signals being sent is two, and the number of clock signals being sent is consistent with the operation of the voltage regulator or other integrated circuit involved. Note that, for user convenience, the number of clock signals to be sent can be documented in a datasheet or user manual associated with the voltage regulator or other integrated circuit involved. One purpose of the clock signals is to specify a time period during which each data bit will be sent. Immediately after the final clock signal is sent, as indicated at 304, a start bit is sent having the same time period as the clock signals. After the start bit is sent, as indicated at 306, the data bits indicating specific fault information are then sent via the fault reporting or PGOOD pin. For example, a data bit can be either a zero or a one (i.e., low or high, respectively). The data bit number (e.g., first data bit, second data bit, etc.) can correspond to the particular fault that was logged into a fault reporting memory circuit and caused the voltage signal on the fault reporting or PGOOD pin to be pulled Low. As indicated at 308, a Stop bit is then sent immediately following the last data bit. In some embodiments, the DATA signal can remain high for a predefined period of time, and the data stream can be iterated again in a repetitive pattern so the user can readily observe the data stream with an oscilloscope or other suitable test instrument to provide an adequate length of time to decode the fault message involved. In some embodiments, the clock signal information can be embedded into the data bit stream as is well known in the art. In those embodiments, clock signals preceding the data bits may not be needed. The data bit stream can be encoded according to any known serial data encoding method.

Figure 4:
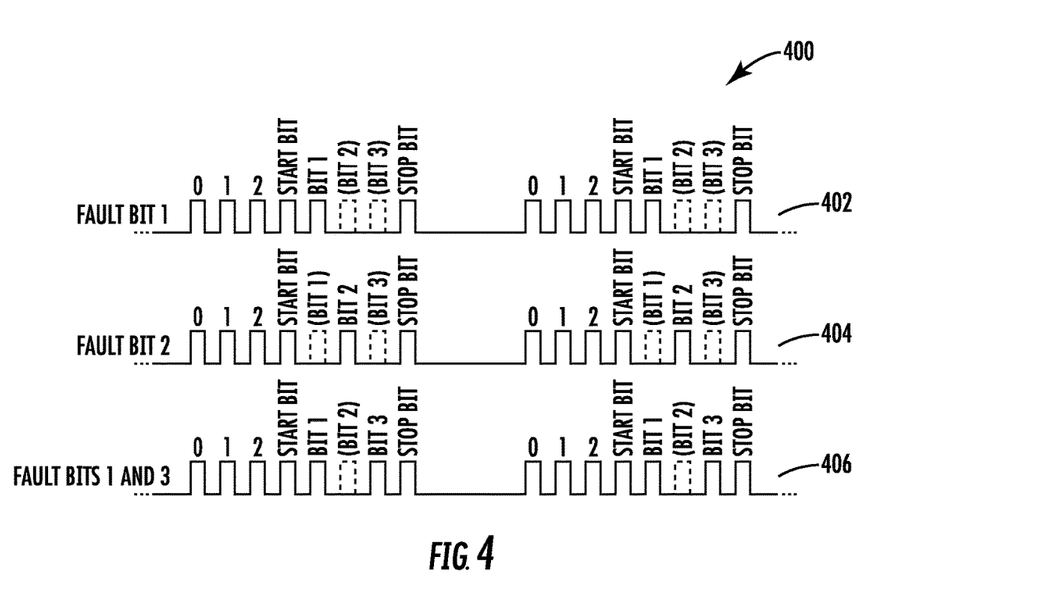
FIG. 4 depicts three voltage waveforms showing data streams that can be utilized to convey fault information over a fault reporting or PGOOD pin, in accordance with one exemplary embodiment of the present invention.

FIG. 4 depicts three exemplary voltage waveforms 400 showing data streams that can be utilized to convey fault information over a fault reporting or PGOOD pin, in accordance with one exemplary embodiment of the present invention. For example, the exemplary voltage waveforms 400 can be conveyed utilizing the fault reporting circuit 102 depicted in FIG. 1. In the exemplary embodiment shown in FIG. 4, three clock signals are being utilized to convey up to three data bits of fault information. For example, as indicated at 402, three clock signals are first sent to establish the timing period. The three clock bits are followed by a start bit, and then the first data bit (Bit 1) is sent high. The next two data bits (Bit 2, Bit 3) are sent low, and the Stop Bit is then sent. For this example embodiment, having only the first data bit high can indicate a first specified fault to the user. As a second example, as indicated at 404, three clock bits are followed by the start bit, and the second data bit (Bit 2) is sent high. The first and third data bits (Bit 1, Bit 3) are sent low, followed by the Stop bit. In this second example, having only the second data bit high can indicate a second specified fault to the user. As a third example, as indicated at 406, three clock bits are followed by the start bit. Then, the data bits 1 and 3 (Bit 1, Bit 3) are sent high, and the second data bit (Bit 2) is sent low. These data bits are then followed by the stop bit. In this third example, the two data bits (Bit 1, Bit 3) sent might indicate to a user that more than one fault (e.g., two faults) occurred and thus caused the voltage signal on the fault reporting or PGOOD pin to go low. Notably, each of the data streams depicted in FIG. 4 can be repeated continuously so that an oscilloscope or other suitable test instrument can be triggered to capture the data stream so that a user can decipher the data bits and understand the fault(s) that caused the voltage regulator (or other integrated circuit) to shut down.

Figure 5:
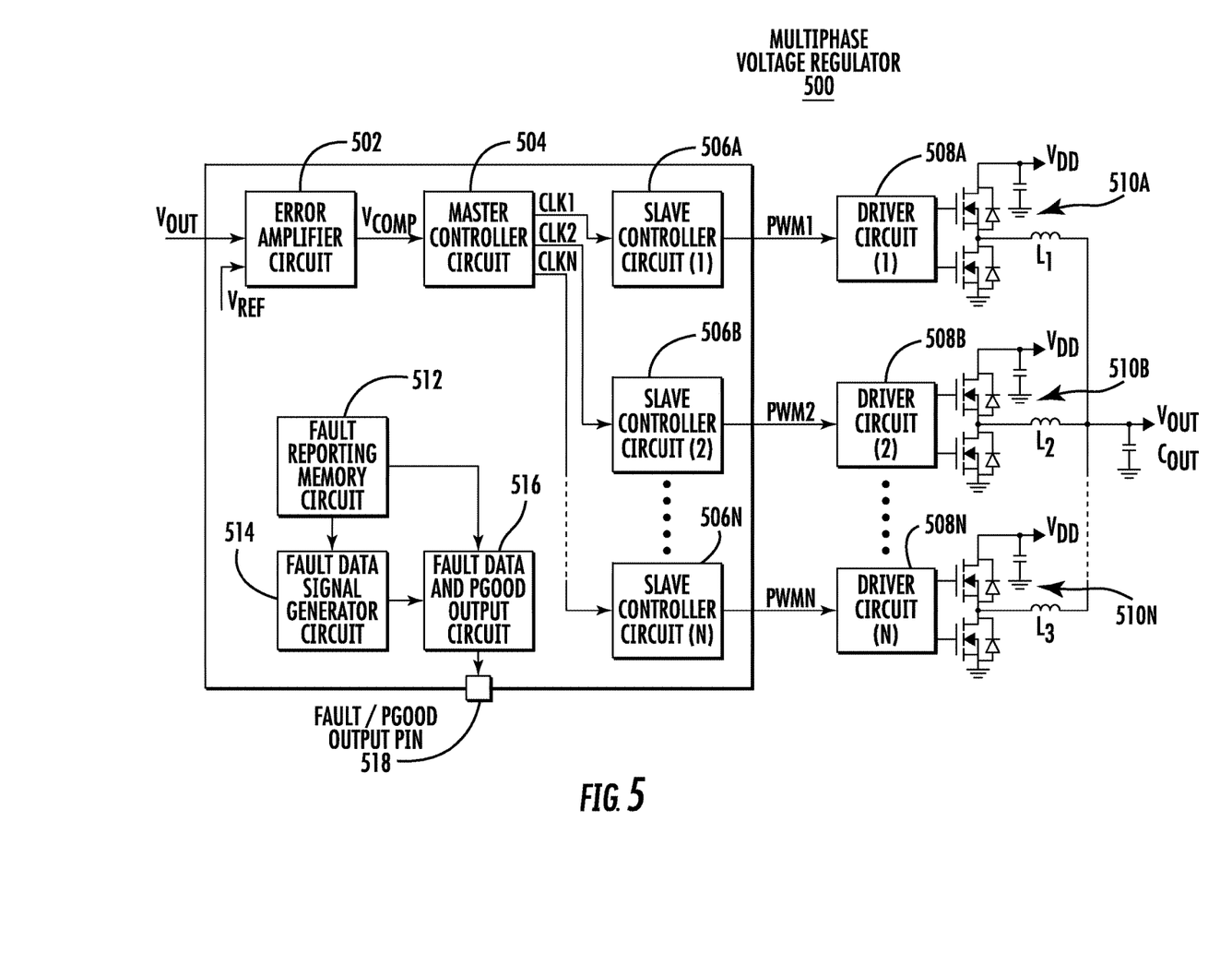
FIG. 5 depicts a schematic circuit diagram of a multiphase pulse-width modulated (PWM) voltage regulator circuit that can be utilized to implement one or more exemplary embodiments of the present invention.

FIG. 5 depicts a schematic circuit diagram of a multiphase pulse-width modulated (PWM) voltage regulator circuit 500, which can be utilized to implement one or more exemplary embodiments of the present invention. For example, the multiphase PWM voltage regulator circuit 500 can be formed on an integrated circuit, wafer, chip or die. Referring to the exemplary embodiment depicted in FIG. 5, the multiphase PWM voltage regulator circuit 500 includes an error amplifier circuit 502 that receives the output voltage, $V_{OUT}$, at a first input, and a reference voltage, $V_{REF}$, at a second input. The error amplifier circuit 502 generates a compensation voltage, $V_{COMP}$, at its output, which is based on the difference between the received output voltage and reference voltage. The compensation voltage, $V_{COMP}$, is coupled to a master controller circuit 504, which includes a master clock generator and phase sequencer. The phase-sequenced clock signals, CLK1, CLK2 . . . CLKN (where N represents the nth clock signal) are coupled to respective slave controller circuits 506A, 506B, . . . 506N (where N represents the nth slave controller circuit). Each slave controller circuit 506A, 506B, . . . 506N generates a respective PWM signal (PWM1, PWM2, . . . PWMN), which is coupled to a respective switching transistor driver circuit 508A, 508B, . . . 508N, which is utilized to PW modulate a respective pair of switching transistors 510A, 510B, . . . 510N. The switching transistors generate the inductor currents in each phase, which charge the output capacitor, $C_{OUT}$, to generate the output voltage, $V_{OUT}$. Signals representative of the inductor currents of the inductors (L1 to L3) may be coupled to the multiphase PWM voltage regulator circuit 500, even though the connection is not shown in the exemplary embodiment depicted in FIG. 5.

In operation, if a fault occurs in the multiphase PWM voltage regulator circuit 500, the fault information is stored in a fault reporting memory circuit 512, e.g., a plurality of registers or other data storage circuit. A fault data signal generator circuit 514 receives the fault information (DATA) from the fault reporting memory circuit 512. A fault data and PGOOD output circuit 516, which can be implemented, for example, utilizing the fault reporting circuit 102 depicted in the exemplary embodiment of FIG. 1, generates a PGOOD signal and DATA signal (e.g., superimposed or combined signal) at the fault DATA/PGOOD output pin 518. For example, the output PGOOD signal and fault DATA signal can be one or more of the signals depicted in FIGS. 2-4. The reported faults can include, for example, specific identifying information about excessive leakage current, overvoltage, undervoltage, current imbalance, overcurrent, undercurrent, thermal, and/or other faults that have occurred and caused the Logic level to go LOW on the fault data/PGOOD output pin 518.

Figure 6:
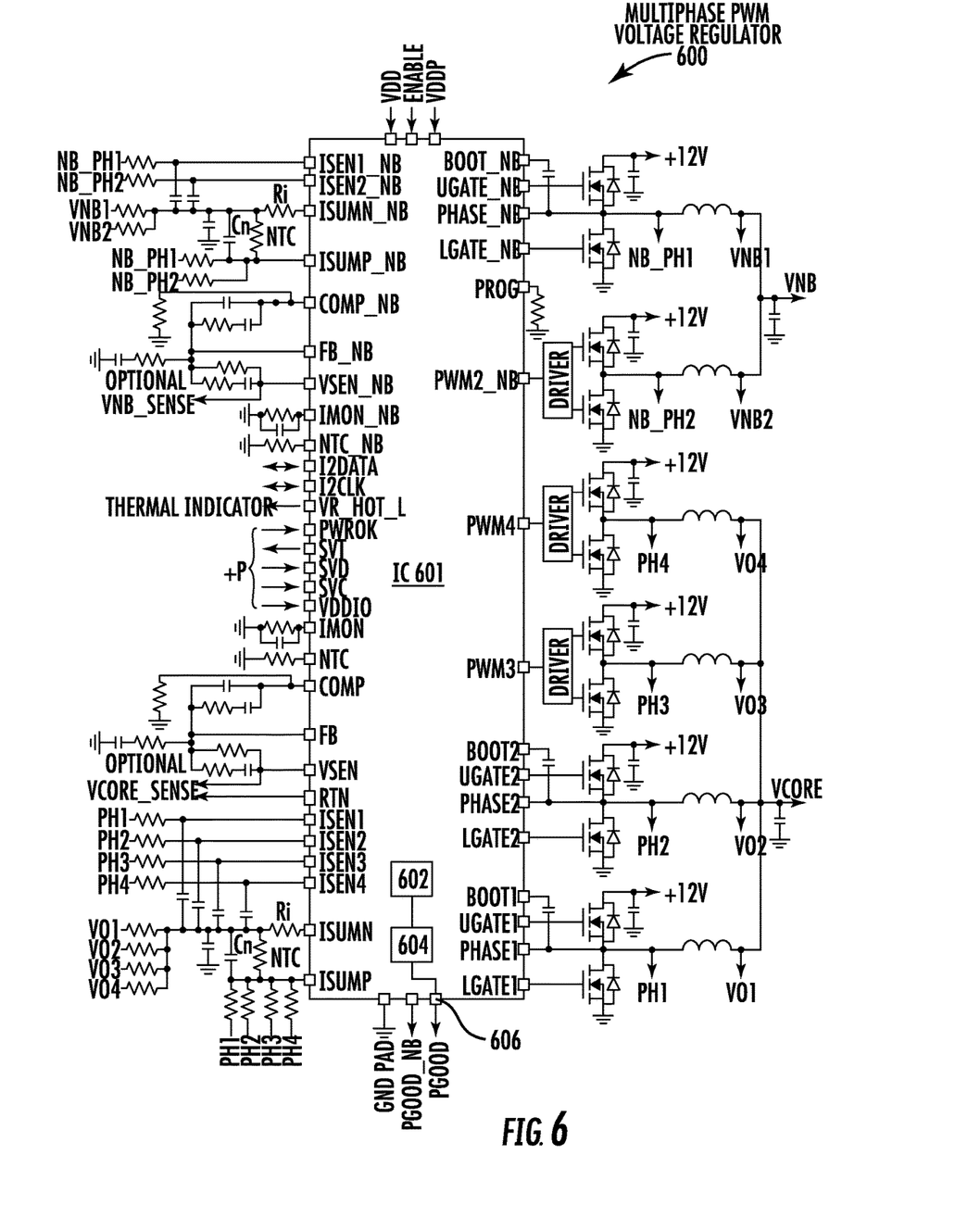
FIG. 6 depicts a schematic block diagram of a multiphase PWM voltage regulator formed on an integrated circuit that can be utilized to implement one or more exemplary embodiments of the present invention.

FIG. 6 depicts a schematic circuit diagram of an exemplary multiphase PWM voltage regulator 600, which can be utilized to implement one or more exemplary embodiments of the present invention. In the exemplary embodiment shown, the multiphase PWM voltage regulator 600 is formed on an integrated circuit 601. The controller included in the multiphase PWM voltage regulator 600 depicted in the exemplary embodiment of FIG. 6 supports two voltage regulators sharing a serial control bus for multiphase Core and Northbridge regulated voltage outputs. Referring to FIG. 6, the multiphase PWM voltage regulator 600 includes a fault reporting memory 602 that is configured to store fault data. A fault data signal generator 604 is coupled to the fault reporting memory 602 and configured to receive the specific fault information stored in the fault reporting memory 602, and generate data signals indicating the specific faults that occurred. The generated data signals (e.g., DATA signals described above with respect to FIGS. 2-4) are conveyed from the fault data signal generator 604 to a user via the PGOOD pin 606.

Figures 7, 8:
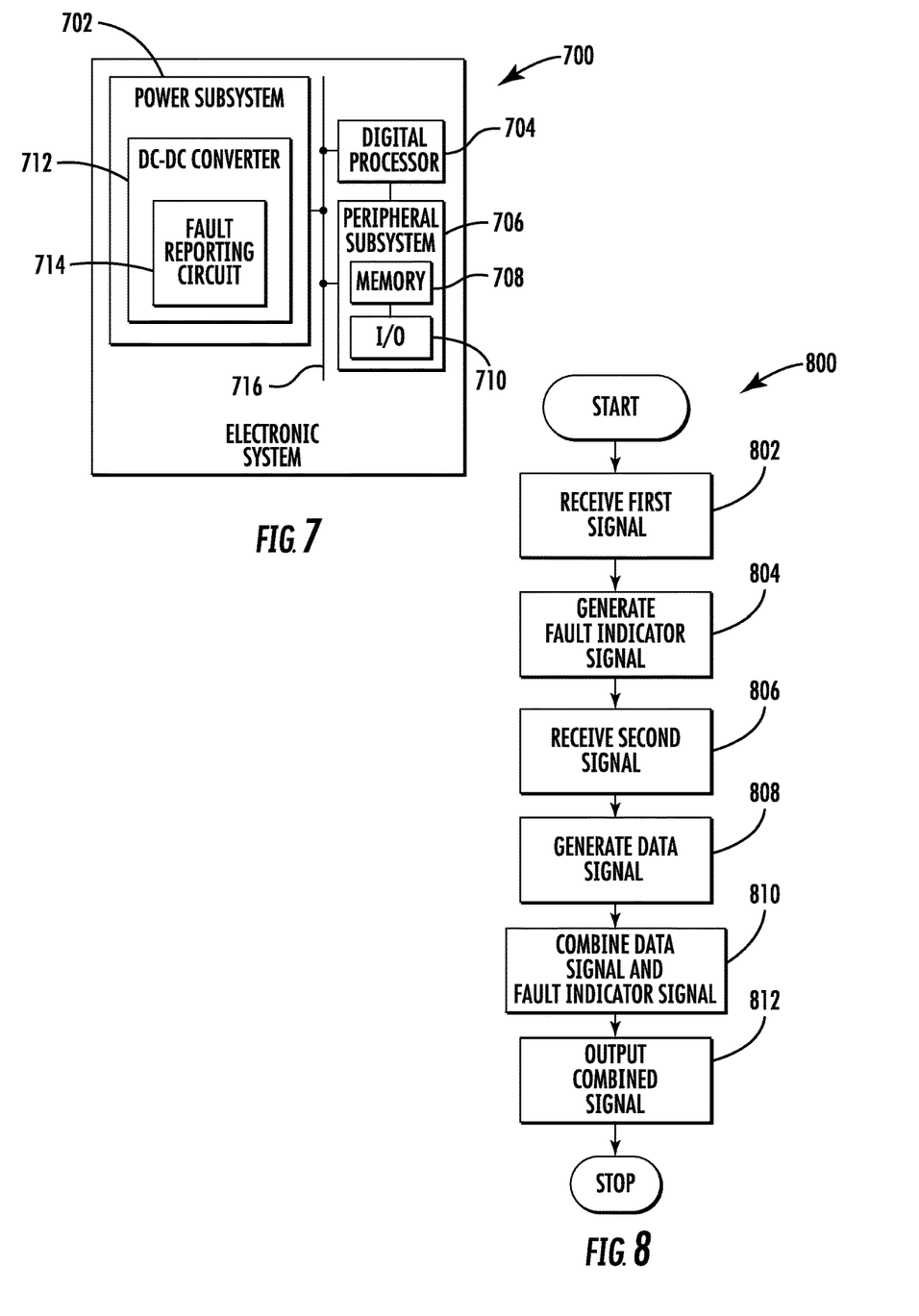
FIG. 7 depicts a schematic block diagram of an electronic system that can be utilized to implement one exemplary embodiment of the present invention.
FIG. 8 is a flow diagram depicting a method for fault reporting, in accordance with one exemplary embodiment of the present invention.

FIG. 7 is a schematic block diagram of an exemplary electronic system 700, which can be utilized to implement one exemplary embodiment of the present invention. In the exemplary embodiment shown, electronic system 700 includes a power subsystem 702, a digital processor 704, and a peripheral subsystem 706. For example, the digital processor 704 can be a CPU and/or a microprocessor or microcontroller and the like. The peripheral subsystem 706 includes a memory 708 for storing the data processed by the digital processor 704, and an input/output (I/O) 710 for transmitting and receiving the data to/from the memory 708 and the digital processor 704. In the exemplary embodiment depicted in FIG. 7, the power subsystem 702 includes a DC-DC converter 712 such as a single phase or multiphase voltage regulator, and a fault reporting circuit 714 for generating and conveying fault data via a fault reporting or PGOOD pin of the DC-DC converter 712. For example, the DC-DC converter 712 can be implemented utilizing the multiphase PWM voltage regulator circuit 100 depicted in FIG. 1, the multiphase voltage regulator 500 depicted in FIG. 5, or the multiphase PWM voltage regulator 600 depicted in FIG. 6. The DC-DC converter 712 and power subsystem 702 provide a regulated voltage via line 716 to power the electronic components in the digital processor 704 and peripheral subsystem 706. In the exemplary embodiment shown in FIG. 7, the fault reporting circuit 714 can be implemented, for example, utilizing the fault reporting circuit 102 depicted in FIG. 1, or alternatively, utilizing the fault data and PGOOD output circuit 516 depicted in the multiphase voltage regulator of FIG. 5. In one or more embodiments, the components of the electronic system 700 can be implemented in one or more integrated circuits, wafers, chips or dies.

FIG. 8 is a flow diagram of a method 800, which can be utilized to implement fault reporting for a DC-DC converter, in accordance with one exemplary embodiment of the present invention. In this embodiment, the method 800 is utilized to implement fault reporting for a voltage regulator. However, in other embodiments, the method 800 can also be utilized to implement fault reporting for other suitable types of voltage converters or voltage regulators in which enhanced fault reporting is desired. Referring to FIGS. 1 and 8, the exemplary method 800 begins by receiving a first signal (e.g., CONTPG signal) at the control terminal of the NFET 106 (802). In response, the NFET 106 generates a fault indicator signal that is below a Logic Low threshold voltage (804). A second signal (e.g., fault DATA signal) is received at the control terminal of the second NFET 114 (806). In response, the second NFET 114 generates a data voltage signal including at least one data signal indicating the identity of the source of the fault involved (808). The data voltage signal is superimposed on, and combined with, the fault indicator signal such that the maximum level of the combined signal is always less than the Logic Low threshold voltage level (810). In one embodiment, the data in the superimposed or combined signal is stored in a memory storage area or one or more registers in the DC-DC converter involved. The superimposed or combined signal, including the data voltage signal and the fault indicator signal, is output via the fault reporting pin 104 (812).

Example Embodiments

Example 1 includes a method for fault reporting, comprising: receiving a first signal indicating an occurrence of a fault; generating a fault indicator signal responsive to the first signal; receiving a second signal indicating an identity of the fault; generating a data signal responsive to the second signal; superimposing the data signal on the fault indicator signal and generating a combined signal; and coupling the combined signal, including the data signal and the fault indicator signal, to a fault reporting output.

Example 2 includes the method of Example 1, wherein the generating a fault indicator signal responsive to the first signal further comprises generating a fault indicator signal responsive to the first signal, which causes the fault indicator signal to stay below a Logic Low threshold.

Example 3 includes the method of any of Examples 1-2, wherein the superimposing the data signal on the fault indicator signal and generating a combined signal further comprises superimposing the data signal on the fault indicator signal and generating a combined signal, wherein a maximum level of the combined signal is less than a Logic Low threshold.

Example 4 includes the method of any of Examples 1-3, wherein the receiving the first signal comprises receiving a fault signal, and the receiving the second signal comprises receiving a data signal.

Example 5 includes the method of any of Examples 1-4, wherein the method for fault reporting comprises a method for fault reporting in a voltage regulator circuit.

Example 6 includes the method of any of Examples 1-5, wherein the generating the fault indicator signal comprises generating a control PGOOD or CONTPG signal.

Example 7 includes the method of any of Examples 1-6, wherein the coupling comprises outputting the combined signal via a PGOOD pin.

Example 8 includes a fault reporting circuit, comprising: a first transistor device configured to generate a first signal indicating an occurrence of a fault in an associated circuit; a second transistor device coupled to the first transistor device, the second transistor device configured to generate at least one data signal indicating an identity of the fault in the associated circuit; and an output coupled to the first transistor device and the second transistor device, wherein the output is configured to receive a combined signal including the first signal and the at least one data signal.

Example 9 includes the fault reporting circuit of Example 8, wherein the at least one data signal is superimposed on the first signal.

Example 10 includes the fault reporting circuit of any of Examples 8-9, wherein the at least one data signal is superimposed on the first signal and creates a combined signal such that the maximum level of the combined signal is always less than a Logic Low threshold level.

Example 11 includes the fault reporting circuit of any of Examples 8-10, wherein the fault reporting circuit comprises a fault reporting circuit in a voltage regulator circuit formed on an integrated circuit, wafer, chip or die.

Example 12 includes the fault reporting circuit of any of Examples 8-11, wherein the output comprises a fault reporting pin or a PGOOD pin of a multiphase pulse-width modulated (PWM) voltage regulator circuit formed on an integrated circuit chip.

Example 13 includes the fault reporting circuit of any of Examples 8-12, wherein the first transistor device and the second transistor device comprise a first N-channel FET (NFET) and a second NFET.

Example 14 includes a voltage regulator circuit, comprising: an error amplifier configured to receive a feedback voltage representing an output voltage of the voltage regulator circuit and a reference voltage, and generate a compensation voltage responsive to a level of the output voltage; a master controller circuit coupled to the error amplifier circuit and configured to generate a phase-sequenced plurality of clock signals responsive to the compensation voltage; a plurality of slave controller circuits coupled to the master controller circuit, wherein each slave controller circuit of the plurality of slave controller circuits is configured to generate a respective pulse-width modulated (PWM) signal responsive to a respective clock signal of the plurality of clock signals; a plurality of switching transistor driver circuits coupled to the plurality of slave controller circuits, wherein each switching transistor driver circuit of the plurality of drive circuits is configured to control an operation of a respective pair of switching transistors responsive to the respective PWM signal; a plurality of inductors, wherein each inductor of the plurality of inductors is coupled to a respective pair of switching transistors and configured to generate a respective inductor current for each phase; an output capacitor coupled to the plurality inductors and configured to generate the output voltage responsive to the inductor currents for each phase; a fault reporting memory circuit configured to receive first fault information including an occurrence of at least one fault in the voltage regulator circuit, and second fault information including an identity of a source of the at least one fault; a fault data signal generator circuit coupled to the fault reporting memory circuit and configured to generate at least one data signal indicating the identity of the source of the at least one fault; a fault data and PGOOD output circuit coupled to the fault reporting memory circuit and the fault data signal generator circuit and configured to output the at least one data signal and a PGOOD signal representing the first fault information, wherein the at least one data signal is superimposed on the PGOOD signal such that a maximum level of the combined signal is less than a threshold level; and a fault reporting pin coupled to the fault data and PGOOD output circuit.

Example 15 includes the voltage regulator circuit of Example 14, wherein the fault data and PGOOD output circuit comprises a fault reporting circuit.

Example 16 includes the voltage regulator circuit of any of Examples 14-15, wherein the fault data and PGOOD output circuit comprises a first transistor device configured to generate the PGOOD signal, and a second transistor device coupled to the first transistor device, the second transistor device configured to generate the at least one data signal.

Example 17 includes the voltage regulator circuit of any of Examples 14-16, wherein the fault reporting memory circuit comprises at least one register.

Example 18 includes the voltage regulator circuit of any of Examples 14-17, wherein the voltage regulator circuit comprises a multiphase PWM voltage regulator circuit formed on an integrated circuit, wafer, chip or die.

Example 19 includes a controller, comprising: an error amplifier circuit configured to receive a feedback voltage signal and a reference voltage signal, and generate a compensation voltage signal responsive to a level of the feedback voltage signal; a master controller circuit coupled to the error amplifier circuit and configured to generate a plurality of clock signals responsive to the compensation voltage signal; a plurality of slave controller circuits coupled to the master controller circuit, wherein each slave controller circuit of the plurality of slave controller circuits is configured to generate a respective pulse-width modulated (PWM) signal responsive to a respective clock signal of the plurality of clock signals; a fault reporting memory circuit configured to receive first fault information including an occurrence of at least one fault in the controller, and second fault information including an identity of a source of the at least one fault; a fault data signal generator circuit coupled to the fault reporting memory circuit and configured to generate at least one data signal indicating the identity of the source of the at least one fault; a fault data and PGOOD output circuit coupled to the fault reporting memory circuit and the fault data signal generator circuit and configured to output the at least one data signal and a PGOOD signal representing the first fault information, wherein the at least one data signal is combined with the PGOOD signal such that a maximum level of the combined signal is less than a threshold level; and a fault reporting pin coupled to the fault data and PGOOD output circuit.

Example 20 includes the controller of Example 19, wherein the fault data and PGOOD output circuit comprises a first transistor device configured to generate the PGOOD signal, and a second transistor device coupled to the first transistor device, the second transistor device configured to generate the at least one data signal.

Example 21 includes the controller of any of Examples 19-20, further comprising a plurality of switching transistor driver circuits coupled to the plurality of slave controller circuits.

Example 22 includes the controller of any of Examples 19-21, wherein the fault reporting memory circuit comprises at least one register or a memory storage circuit.

Example 23 includes the controller of any of Examples 19-22, wherein the controller comprises a multiphase PWM switching controller formed on an integrated circuit, wafer, chip or die.

Example 24 includes an electronic system, comprising: a digital processor; a peripheral subsystem coupled to the digital processor; and a power subsystem coupled to the digital processor and circuit components of the peripheral subsystem and configured to generate an output voltage to power the digital processor and the circuit components of the peripheral subsystem, wherein the power subsystem includes a DC-DC converter configured to regulate the output voltage of the power subsystem, and the DC-DC converter includes a fault reporting circuit comprising: a first transistor device configured to generate a first signal indicating an occurrence of a fault in an associated DC-DC converter circuit; a second transistor device coupled to the first transistor device, the second transistor device configured to generate at least one data signal indicating an identity of the fault in the associated DC-DC converter circuit; and an output pin coupled to the first transistor device and the second transistor device, wherein the output pin is configured to receive the first signal and the at least one data signal.

Example 25 includes the electronic system of Example 24, wherein the DC-DC converter comprises a voltage regulator.

Example 26 includes the electronic system of any of Examples 24-25, wherein the output pin comprises a PGOOD pin.

Example 27 includes the electronic system of any of Examples 24-26, wherein the first voltage signal is a PGOOD signal, and the at least one data signal is superimposed on the PGOOD signal such that a maximum level of a combined at least one data signal and PGOOD signal is less than a threshold level.

Although specific embodiments have been illustrated and described herein, it will be appreciated by those of ordinary skill in the art that any arrangement, which is calculated to achieve the same purpose, may be substituted for the specific embodiments shown. It will also be appreciated that the disclosed method can be utilized not only in voltage converter and voltage regulator circuits, but also in any other electronic circuit that utilizes a fault indicator pin or output. Therefore, it is manifestly intended that the present application be limited only by the claims and the equivalents thereof.

What is claimed is:

1. A method for fault reporting, comprising:
receiving a first signal indicating an occurrence of a fault;
generating a fault indicator signal responsive to the first signal;
receiving a second signal indicating an identity of the fault;
generating a data signal responsive to the second signal;
superimposing the data signal on the fault indicator signal and generating a combined signal; and
coupling the combined signal, simultaneously including both the data signal and the fault indicator signal, to a fault reporting output.

2. The method of claim 1, wherein the generating a fault indicator signal responsive to the first signal further comprises generating a fault indicator signal responsive to the first signal, which causes the fault indicator signal to stay below a Logic Low threshold.

3. The method of claim 1, wherein the superimposing the data signal on the fault indicator signal and generating a combined signal further comprises superimposing the data signal on the fault indicator signal and generating a combined signal, wherein a maximum level of the combined signal is less than a Logic Low threshold.

4. The method of claim 1, wherein the receiving the first signal comprises receiving a fault signal, and the receiving the second signal comprises receiving a data signal.

5. The method of claim 1, wherein the method for fault reporting comprises a method for fault reporting in a voltage regulator circuit.

6. The method of claim 1, wherein the generating the fault indicator signal comprises generating a control PGOOD or CONTPG signal.

7. The method of claim 1, wherein the coupling comprises outputting the combined signal via a PGOOD pin.

8. A fault reporting circuit, comprising:
a first transistor device configured to generate a first signal indicating an occurrence of a fault in an associated circuit;
a second transistor device coupled to the first transistor device, the second transistor device configured to generate at least one data signal indicating an identity of the fault in the associated circuit; and
an output coupled to the first transistor device and the second transistor device, wherein the output is configured to output a combined signal simultaneously including both the first signal and the at least one data signal.

9. The fault reporting circuit of claim 8, wherein the at least one data signal is superimposed on the first signal.

10. The fault reporting circuit of claim 8, wherein the at least one data signal is superimposed on the first signal and creates a combined signal such that the maximum level of the combined signal is always less than a Logic Low threshold level.

11. The fault reporting circuit of claim 8, wherein the fault reporting circuit comprises a fault reporting circuit in a voltage regulator circuit formed on an integrated circuit, wafer, chip or die.

12. The fault reporting circuit of claim 8, wherein the output comprises a fault reporting pin or a PGOOD pin of a multiphase pulse-width modulated (PWM) voltage regulator circuit formed on an integrated circuit chip.

13. The fault reporting circuit of claim 8, wherein the first transistor device and the second transistor device comprise a first N-channel FET (NFET) and a second NFET.

14. A voltage regulator circuit, comprising:
an error amplifier configured to receive a feedback voltage representing an output voltage of the voltage regulator circuit and a reference voltage, and generate a compensation voltage responsive to a level of the output voltage;
a master controller circuit coupled to the error amplifier circuit and configured to generate a phase-sequenced plurality of clock signals responsive to the compensation voltage;
a plurality of slave controller circuits coupled to the master controller circuit, wherein each slave controller circuit of the plurality of slave controller circuits is configured to generate a respective pulse-width modulated (PWM) signal responsive to a respective clock signal of the plurality of clock signals;
a plurality of switching transistor driver circuits coupled to the plurality of slave controller circuits, wherein each switching transistor driver circuit of the plurality of drive circuits is configured to control an operation of a respective pair of switching transistors responsive to the respective PWM signal;
a plurality of inductors, wherein each inductor of the plurality of inductors is coupled to a respective pair of switching transistors and configured to generate a respective inductor current for each phase;
an output capacitor coupled to the plurality inductors and configured to generate the output voltage responsive to the inductor currents for each phase;
a fault reporting memory circuit configured to receive first fault information including an occurrence of at least one fault in the voltage regulator circuit, and second fault information including an identity of a source of the at least one fault;
a fault data signal generator circuit coupled to the fault reporting memory circuit and configured to generate at least one data signal indicating the identity of the source of the at least one fault;
a fault data and PGOOD output circuit coupled to the fault reporting memory circuit and the fault data signal generator circuit and configured to output the at least one data signal and a PGOOD signal representing the first fault information, wherein the at least one data signal is superimposed on the PGOOD signal such that a maximum level of the combined signal is less than a threshold level; and
a fault reporting pin coupled to the fault data and PGOOD output circuit.

15. The voltage regulator circuit of claim 14, wherein the fault data and PGOOD output circuit comprises a fault reporting circuit.

16. The voltage regulator circuit of claim 14, wherein the fault data and PGOOD output circuit comprises a first transistor device configured to generate the PGOOD signal, and a second transistor device coupled to the first transistor device, the second transistor device configured to generate the at least one data signal.

17. The voltage regulator circuit of claim 14, wherein the fault reporting memory circuit comprises at least one register.

18. The voltage regulator circuit of claim 14, wherein the voltage regulator circuit comprises a multiphase PWM voltage regulator circuit formed on an integrated circuit, wafer, chip or die.

19. A controller, comprising:
an error amplifier circuit configured to receive a feedback voltage signal and a reference voltage signal, and generate a compensation voltage signal responsive to a level of the feedback voltage signal;
a master controller circuit coupled to the error amplifier circuit and configured to generate a plurality of clock signals responsive to the compensation voltage signal;
a plurality of slave controller circuits coupled to the master controller circuit, wherein each slave controller circuit of the plurality of slave controller circuits is configured to generate a respective pulse-width modulated (PWM) signal responsive to a respective clock signal of the plurality of clock signals;
a fault reporting memory circuit configured to receive first fault information including an occurrence of at least one fault in the controller, and second fault information including an identity of a source of the at least one fault;
a fault data signal generator circuit coupled to the fault reporting memory circuit and configured to generate at least one data signal indicating the identity of the source of the at least one fault;
a fault data and PGOOD output circuit coupled to the fault reporting memory circuit and the fault data signal generator circuit and configured to output the at least one data signal and a PGOOD signal representing the first fault information, wherein the at least one data signal is combined with the PGOOD signal such that a maximum level of the combined signal is less than a threshold level; and
a fault reporting pin coupled to the fault data and PGOOD output circuit.

20. The controller of claim 19, wherein the fault data and PGOOD output circuit comprises a first transistor device configured to generate the PGOOD signal, and a second transistor device coupled to the first transistor device, the second transistor device configured to generate the at least one data signal.

21. The controller of claim 19, further comprising a plurality of switching transistor driver circuits coupled to the plurality of slave controller circuits.

22. The controller of claim 19, wherein the fault reporting memory circuit comprises at least one register or a memory storage circuit.

23. The controller of claim 19, wherein the controller comprises a multiphase PWM switching controller formed on an integrated circuit, wafer, chip or die.

24. An electronic system, comprising:
a digital processor;
a peripheral subsystem coupled to the digital processor; and
a power subsystem coupled to the digital processor and circuit components of the peripheral subsystem and configured to generate an output voltage to power the digital processor and the circuit components of the peripheral subsystem, wherein the power subsystem includes a DC-DC converter configured to regulate the output voltage of the power subsystem, and the DC-DC converter includes a fault reporting circuit comprising:
a first transistor device configured to generate a first signal indicating an occurrence of a fault in an associated DC-DC converter circuit;
a second transistor device coupled to the first transistor device, the second transistor device configured to generate at least one data signal indicating an identity of the fault in the associated DC-DC converter circuit; and
an output pin coupled to the first transistor device and the second transistor device,
wherein the output pin is configured to output a combined signal simultaneously including both the first signal and the at least one data signal.

25. The electronic system of claim 24, wherein the DC-DC converter comprises a voltage regulator.

26. The electronic system of claim 24, wherein the output pin comprises a PGOOD pm.

27. The electronic system of claim 24, wherein the first voltage signal is a PGOOD signal, and the at least one data signal is superimposed on the PGOOD signal such that a maximum level of a combined at least one data signal and PGOOD signal is less than a threshold level.

* * * * *